United States Patent [19]
Gutjahr

[11] 3,965,744
[45] June 29, 1976

[54] EQUIPMENT FOR COMPENSATING FOR SENSOR VARIATIONS

[75] Inventor: Lothar Gutjahr, Denzlingen, Germany

[73] Assignee: Klockner-Werke AG, Duisburg, Germany

[22] Filed: Apr. 16, 1975

[21] Appl. No.: 568,579

[30] Foreign Application Priority Data
Apr. 25, 1974 Germany............................ 2419914

[52] U.S. Cl................................. 73/393; 324/130; 264/40; 425/149
[51] Int. Cl.²......................................... G01L 19/04
[58] Field of Search............ 73/393, 432 R; 324/130; 264/40; 425/149; 328/162, 163; 235/151.33

[56] References Cited
UNITED STATES PATENTS

| | | | |
|---|---|---|---|
| 3,430,227 | 2/1969 | Hillis................................... | 324/130 |
| 3,646,815 | 3/1972 | Martin et al.......................... | 73/393 |
| 3,859,400 | 1/1975 | Ma....................................... | 264/40 |

*Primary Examiner*—James J. Gill
*Assistant Examiner*—Anthony V. Ciarlante
*Attorney, Agent, or Firm*—Michael J. Striker

[57] ABSTRACT

The output of the sensor whose variations are to be compensated is applied to one input of a DC amplifier whose other input is connected to an analog storage. The output of the DC amplifier is applied to a voltage-controlled oscillator whose frequency varies as a function of the voltage applied thereto. A phase detector compares the output of the voltage controlled oscillator to a standard reference frequency and furnishes a DC compensating voltage corresponding to the difference therebetween. Prior to each measurement the DC compensating voltage is applied to the analog storage thereby forming a closed loop circuit and causing the voltage controlled oscillator to oscillate at its standard frequency. At the start of the measurement the connection between the phase detector and the analog storage is broken thereby causing the DC compensating voltage present at the beginning of the measurement to be applied to the DC amplifier throughout the measurement. The frequency of the output of the voltage controlled oscillator then varies as a function of the sensed signal and is counted by a counter controlled by timing signals derived from the oscillator furnishing the standard frequency signal to the phase detector.

8 Claims, 6 Drawing Figures

EQUIPMENT FOR COMPENSATING FOR SENSOR VARIATIONS

BACKGROUND OF THE INVENTION

The present invention relates to equipment for compensating for variations in sensors forming part of measuring apparatus. In particular variations such as temperature variations resulting from changes in the ambient conditions are to be compensated. In this type of apparatus, measurement occurs in a number of measuring cycles and, at the beginning of each measuring cycle, the measurement is carried out with respect to a given reference value. A preferred field of application of the present invention is the compensation of temperature variations of sensor characteristics in injection molding machines.

Quite generally speaking, when measuring any characteristics such as pressure, temperature, torque, etc., changes in sensor characteristics due to changes in ambient conditions result in errors in the measurement. For example, when measuring pressure, changes in temperature can cause errors; in the opposite case, for temperature measurements, changes in pressure can result in the same effect. As a further example, changes in temperature can cause errors when measuring the stress and strain in machine parts by means of strain gauges. The temperature changes also introduce an error when determining the pressure in injection molding machinery. While, in many cases, it is possible to eliminate or decrease the influence of temperature by the use of bridge or other compensating circuits at the place of measurement, this is not always possible. For example, particularly in injection molding machines lack of space at the location of the sensor does not allow the introduction of compensating equipment. Further, such circuits usually operate correctly only within predetermined temperature ranges while temperature changes in excess of the determined temperature range again cause errors in the measurement.

SUMMARY OF THE INVENTION

It is an object of the present invention to furnish apparatus which will compensate for errors in the sensor caused by changes in ambient conditions. The equipment is to be suitable for placement at a location away from the measurement location and is to be adequate for compensating over a very wide range and without the use of additional sensors for sensing the change in the parameter causing the errors.

The present invention resides in measurement equipment having sensor means for measuring a determined characteristic and furnishing a sensor output signal indicative of the value thereof. The sensor output signal undergoes undesired variations as a function of at least one characteristic other than said determined characteristic. The present invention comprises DC amplifier means having a first input connected to said sensor means for receiving said sensor output signal, a second input, and an amplifier output for furnishing an amplifier output signal varying as a function of the difference between the signals at said first and second inputs. Analog-digital converter means are connected to said DC amplifier means and furnish a digital signal having a frequency corresponding to the amplitude of the amplifier output signal. A frequency stabilized oscillator furnishes a frequency stabilized signal. Phase detector means compare the frequency of the digital signal to that of the frequency stabilized signal and furnish a DC compensating voltage corresponding to the difference therebetween. Storage means are connected to the second input of the DC amplifier means. Further, means are furnished for connecting the storage means to the output of the phase detector means immediately prior to each measurement thereby furnishing a closed loop circuit wherein the compensating voltage is such that the voltage-controlled oscillator operates at its standard frequency. At the start of the measurement the connection between the phase detector and the analog storage is broken causing the compensating voltage throughout the measurement to remain the same, namely equal to the compensating voltage at the start of the measurement. The frequency of the digital signal then varies as a function of the sensor output signal during the measurement. Since the sensor output signal prior to measurement, that is while the compensating voltage was being established, was a known reference value such as zero, the frequency at the output of the analog-digital converter constitutes a measure of the change in the determined characteristic being measured from the reference value. The compensating voltage throughout the measurement has of course a value which compensates for the particular temperature existing at the beginning of the measurement. In a preferred embodiment of the present invention counter means are provided which are connected to the output of the analog-digital converter and which furnish a counting output signal indicative of the frequency of the digital output signal under control of timing signals derived from the oscillator furnishing the stabilized frequency signal mentioned above to the phase detector. In a preferred embodiment of the present invention the counter may be calibrated directly in pressure units. This may be achieved by feeding into the DC amplifier voltages which correspond to specific pressures sensed by the sensor means.

In a preferred embodiment of the present invention the timing signals are derived from two monostable multivibrators, the first of which receives a frequency corresponding to a subdivided multiple of the stabilized oscillator frequency. The output pulse of the first monostable multivibrator is used to effect the transfer from the counter to a display, while the output of the second monostable multivibrator, and more specifically the trailing edge thereof, is used to clear the counters. Use of these two monostable multivibrators allows the counter control circuitry to be reduced to a minimum while avoiding errors introduced by the delay times associated with the standard circuitry.

In a further preferred embodiment of the present invention a peak detector is connected to the output of the DC amplifier. When it is determined that the DC amplifier output has reached a peak, the further transfer from counter to display is inhibited. Thus the maximum pressure value can be read out from the display. This would otherwise not be possible since it would pass too rapidly to be visually perceived.

In a further preferred embodiment of the present invention a comparator is connected to the output of the counting means and compares the count on the counting means to a reference count. When the two are equal or when the former exceeds the latter, a control signal may be given which causes a particular action to take place in the equipment whose characteristic is being measured. Thus, when the pressure in the injection molding machine, for example, has reached a predetermined pressure any further increase in pressure may be inhibited.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
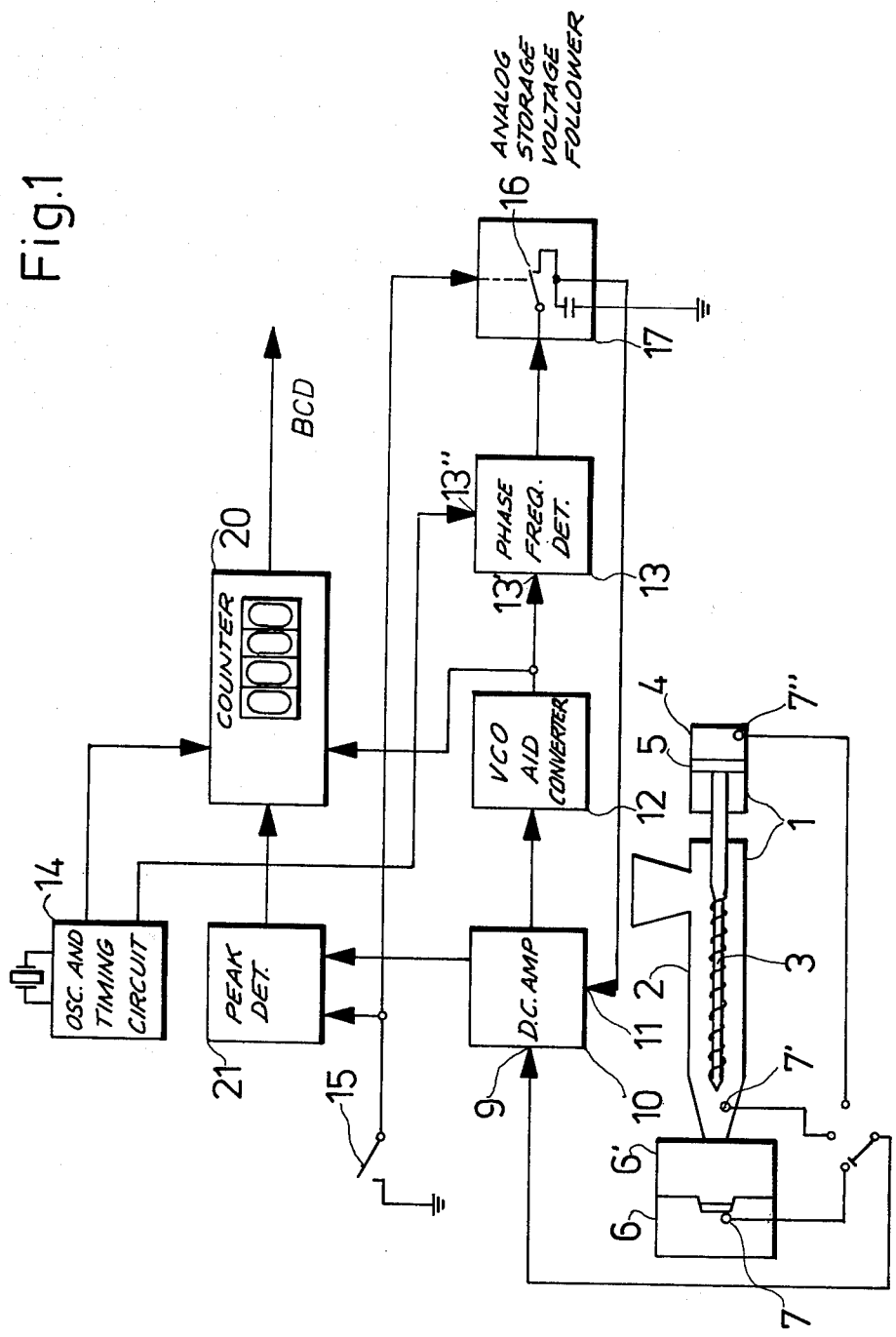
FIG. 1 is a block diagram of a preferred embodiment of the present invention as utilized for compensating for temperature effects in an injection molding machine.

A preferred embodiment of the present invention will now be described with reference to the drawing.

In FIG. 1, reference numeral 1 denotes the injection arrangement in an injection molding machine. It comprises a cylinder 2 containing a helix 3 which, when driven by a motor which is not shown, is used to plasticize the granulate introduced into the cylinder by putting the same into rotation. It is further used to inject the plasticized material and, for this purpose, is connected to a hydraulic cylinder 4 which contains a piston 5 which causes the plasticized material to be injected into the mold consisting of mold halves 6 and 6' through an opening which is not shown. The sensor 7 which senses the pressure which is built up in the mold comprises, in a preferred embodiment of the present invention, a plurality of strain gauges which are connected in a bridge circuit and housed in a common housing. The output signal of sensor 7 is applied to the input 9 of a DC amplifier 10 which also has a compensating input 11, herein referred to as a second input. The compensating voltage applied to this input will be further explained below. The voltage applied at input 9, the first input, is amplified by DC amplifier 10, while the compensating voltage causes a displacement of the output level. The output voltage of the DC amplifier, herein referred to as the amplifier output voltage, of course comprises components resulting from the voltages at the inputs 9 and 11. The DC amplifier output voltage is applied to a voltage-controlled oscillator 12, a preferred embodiment of analog-digital converter means. The base frequency of voltage controlled oscillator 12 is denoted by $f_1$.

The frequency of the signal at the output of oscillator 12 constitutes a measure of the DC voltage applied to its input. Thus, a conversion from an analog to a digital signal occurs. The digital signal at the output of voltage-controlled oscillator 12 is applied to an input 13' of phase detector 13 whose second input 13'' receives a stabilized frequency signal having a frequency $f_2$ from a frequency stabilized quartz oscillator 14. The output signal of the phase detector, herein referred to as a DC compensating voltage, is a DC voltage whose amplitude corresponds to the frequency difference between frequencies $f_1$ and $f_2$. A switch 16, a preferred embodiment of connecting means, connects the output of phase detector 13 to an analog storage 17, indicated schematically as a capacitor. Thus a closed loop circuit is created which will cause voltage-controlled oscillator 12 to oscillate at frequency $f_1$ as long as switch 16 is closed. This is because any changes in temperature which cause a change in the signal furnished by sensor 7 will immediately be compensated for by changes in the compensating voltage applied at input 11 of DC amplifier 10. Immediately prior to each measurement cycle, switch 15 is open and switch 16 is closed (see also point x in FIG. 3). A reference pressure exists in the mold (zero pressure) so that the compensating voltage compensates for the temperature effects.

At the beginning of each measurement cycle, switch 15 is closed and switch 16 is opened and is maintained opened during the whole measurement. Thus the compensating voltage at input 11 of DC amplifier 10 will have the value that it had at the beginning of the measurement, that is the temperature at the beginning of the measurement is compensated for. Variations in pressure then cause variations in the output signal of sensor 7 which in turn cause variations in the DC amplifier output signal. Corresponding changes in the frequency of voltage-controlled oscillator 12 then occur. In a preferred embodiment of the present invention the output frequency of voltage controlled oscillator 12 is proportional to the pressure changes.

Counting means 20 are connected to the output of voltage controlled oscillator 12 and furnish a counting output signal. The counter may be directly calibrated in pressure units. Thus, in order to calibrate the counter, voltages corresponding to the voltages furnished by sensor 7 at different mold pressures are applied to input 9 of DC amplifier 10 and the corresponding display of the counting output signal is calibrated accordingly.

Figure 2:
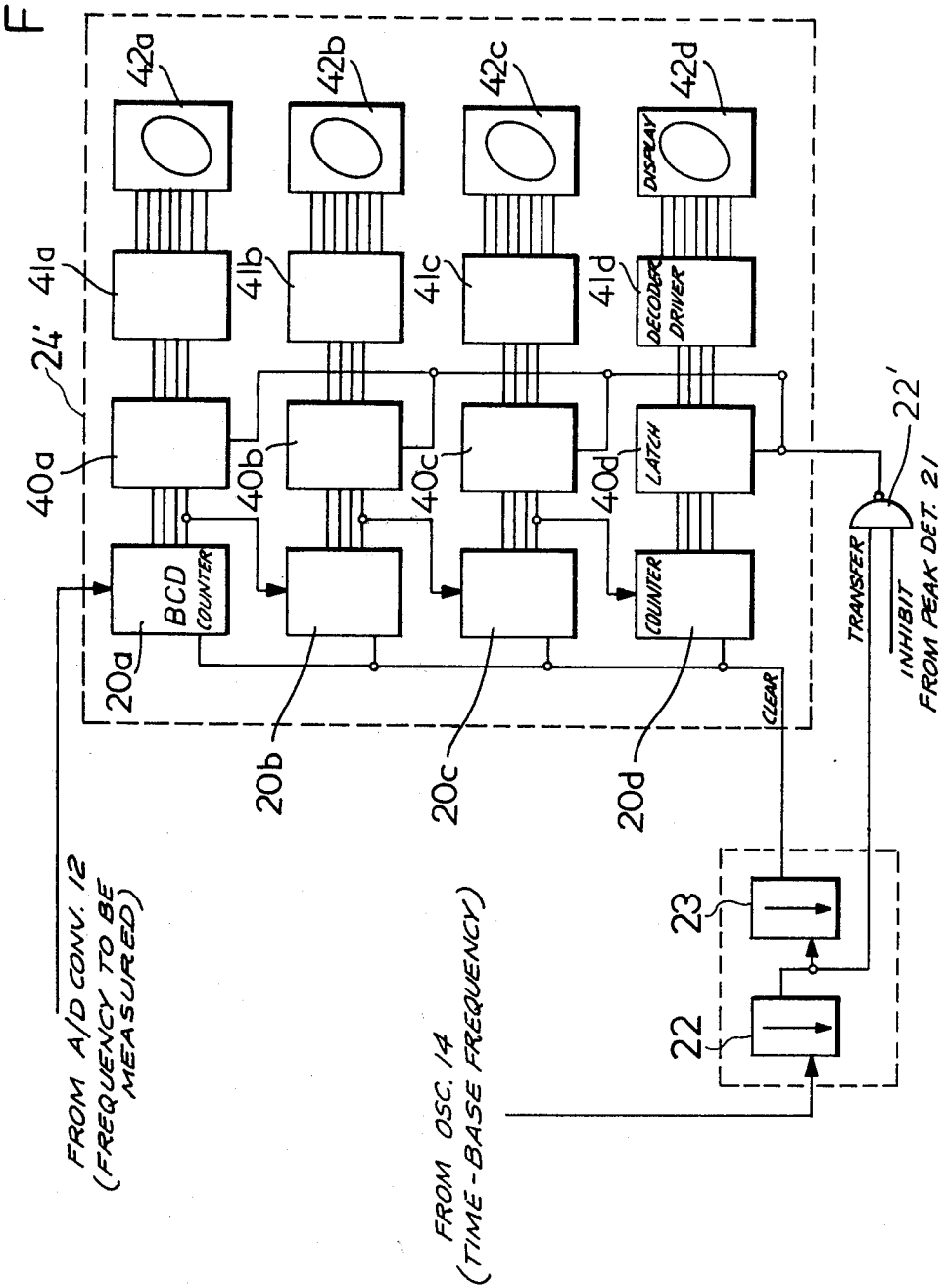
FIG. 2 is a preferred embodiment of the counting means shown in FIG. 1.

The timing signals controlling counter 20, as well as the connections between counter 20 and the display units is shown in FIG. 2. A first multivibrator 22 receives signals from oscillator 14. It should be noted that the signals accepted from oscillator 14 can be either symmetrical or unsymmetrical. The trailing edge of the output signal of monostable multivibrator 22 constitutes a transfer signal which is applied to a gate 22' whose other input is an inhibit signal from peak detector 21 shown in FIG. 1 to be connected to the output of DC amplifier 10. This signal will be discussed in greater detail below. The output of gate 22' is connected to a latch 40. Specifically, counter 20, shown as binary coded decimal stages 20a, 20b, 20c and 20d, has connected to each of these stages a corresponding latch 40a, 40b, 40c and 40d. The latch comprises a storage into which values are entered only upon receipt of an enabling signal, namely a signal from gate 22'. The latch units each have inputs connected to the corresponding counter stage. The signals stored in latches 40a–40d are applied to decoder driver units 41a–41d whose output is then applied to the display.

The above-described circuit operates as follows: The generally unsymmetrical signal from oscillator 14 is applied to monostable multivibrator 22 which responds to a particular portion thereof, such as for example the leading edge in each cycle, to switch to the unstable state. It remains in the unstable state for a predetermined time interval and, when returning to its stable state, sets monostable multivibrator 23 and further furnishes a transfer signal to the above-described gate 22'. Monostable multivibrator 23 also stays in the unstable state for a predetermined time interval as determined by its timing circuit and then furnishes a clear signal which clears counter 20a–20d. Only in the presence of the transfer signal and the absence of the inhibit signal does gate 22' furnish an enable signal to latches 40a–40d which enables them to furnish a new number to the corresponding ones of decoder drivers 41a–41d. The time interval during which the counters count is thus determined by the signals from oscillator 14 and the timing signal furnishing means, namely monostable multivibrators 22 and 23. The count on the counters thus depends upon the frequency to be measured, namely the frequency of the digital signal furnished at the output of analog-digital converter 12.

If it is desired that the display display the peak pressure achieved in the mold during each cycle, then peak detector 21 of FIG. 1 is utilized. This peak detector compares each incoming value from DC amplifier 10 with the previous value and furnishes an inhibit signal when the present value is less than the previous value. Thus the value displayed on the display means 42a–42d will be the peak pressure achieved in the mold during the injection process. Of course closing of switch 15 clears peak detector 21 so that the values during each measurement are independent of previously found values. It should be further noted that the above-described circuit can be utilized to measure time rather than frequency by interchanging the "frequency to be measured" and "time base frequency" signals.

Figure 3:
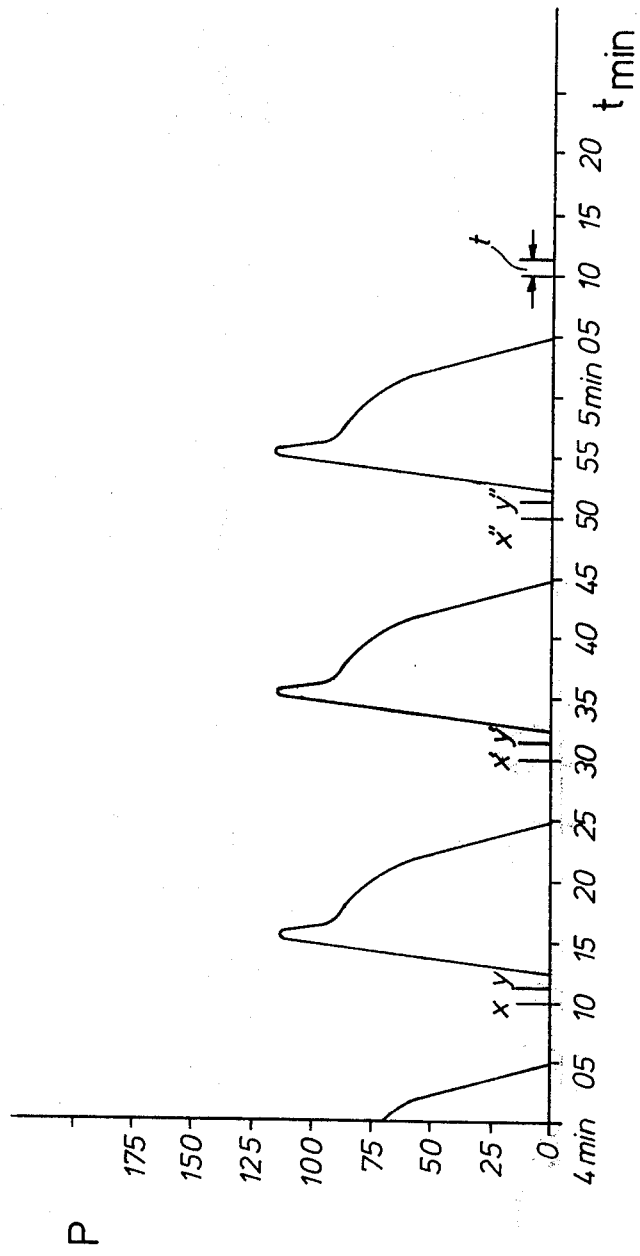
FIG. 3 is a diagram showing pressure variations within individual cycles in an injection molding machine.

In FIG. 3 the measuring process is illustrated with respect to an injection molding machine. The time axis is the abcissa while the coordinate represents the pressure existing in the mold. The pressure is zero during the time the mold is open, the molding product is removed and the mold is closed again for the next cycle. Upon activation of the hydraulic control, which is not shown in the Figures, the injection pressure is again applied to the plasticized mass so that the next cycle shown in FIG. 3 takes place. For each measurement (points $y$, $y'$, etc.) switch 15 is closed opening switch 16. Switch 15 is opened again at the subsequent point $x$ ($x'$, $x''$, etc.).

Figure 4:
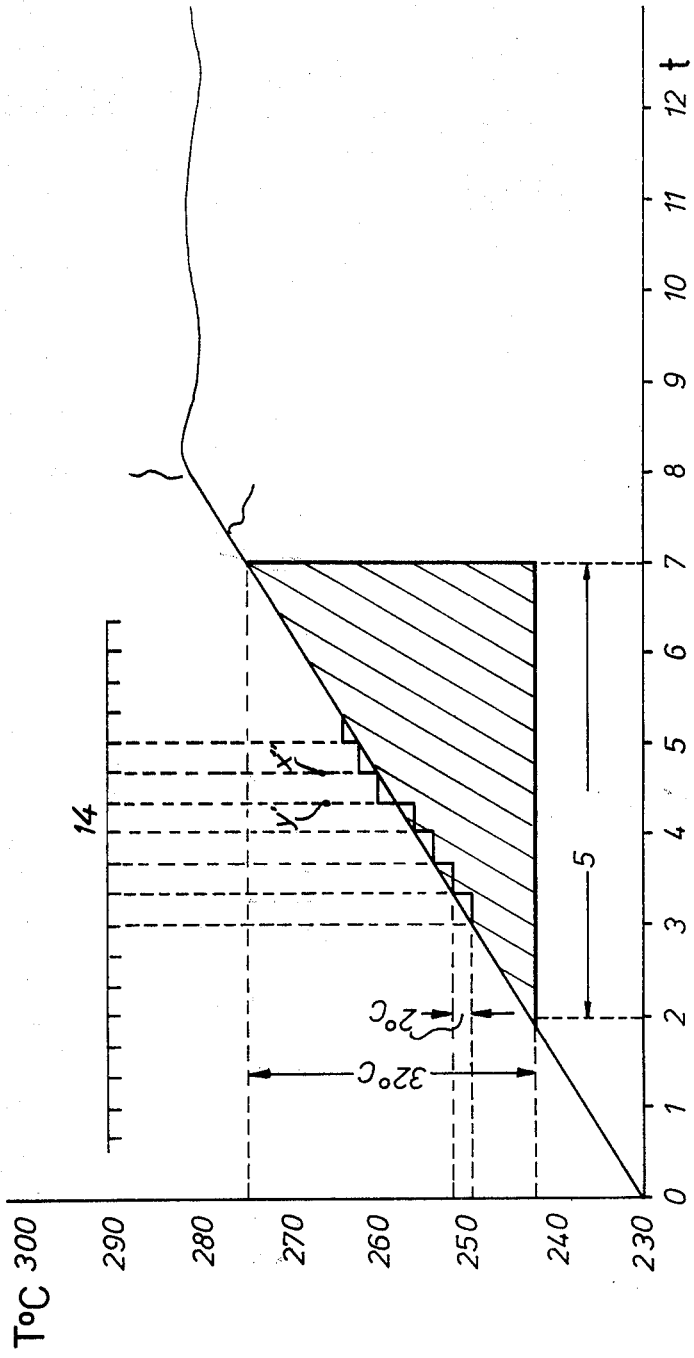
FIG. 4 shows the last portion of the temperature variation while starting up the injection molding machine and the later temperature variations about a mean value.

As shown in FIG. 4, the injection molding machine undergoes a temperature change of approximately 32°C within a time interval of approximately 5 minutes, during the start-up of the machine. The horizontal portions of each step indicate each measurement interval, the time period between the opening of switch 15 and the closing of the same, namely the time interval indicated by $t$ in FIG. 3 being too small to be visible on FIG. 4. However it is this opening and subsequent closing of switch 15 and the corresponding action of switch 16 which causes the equipment to be temperature compensated.

Figure 5:
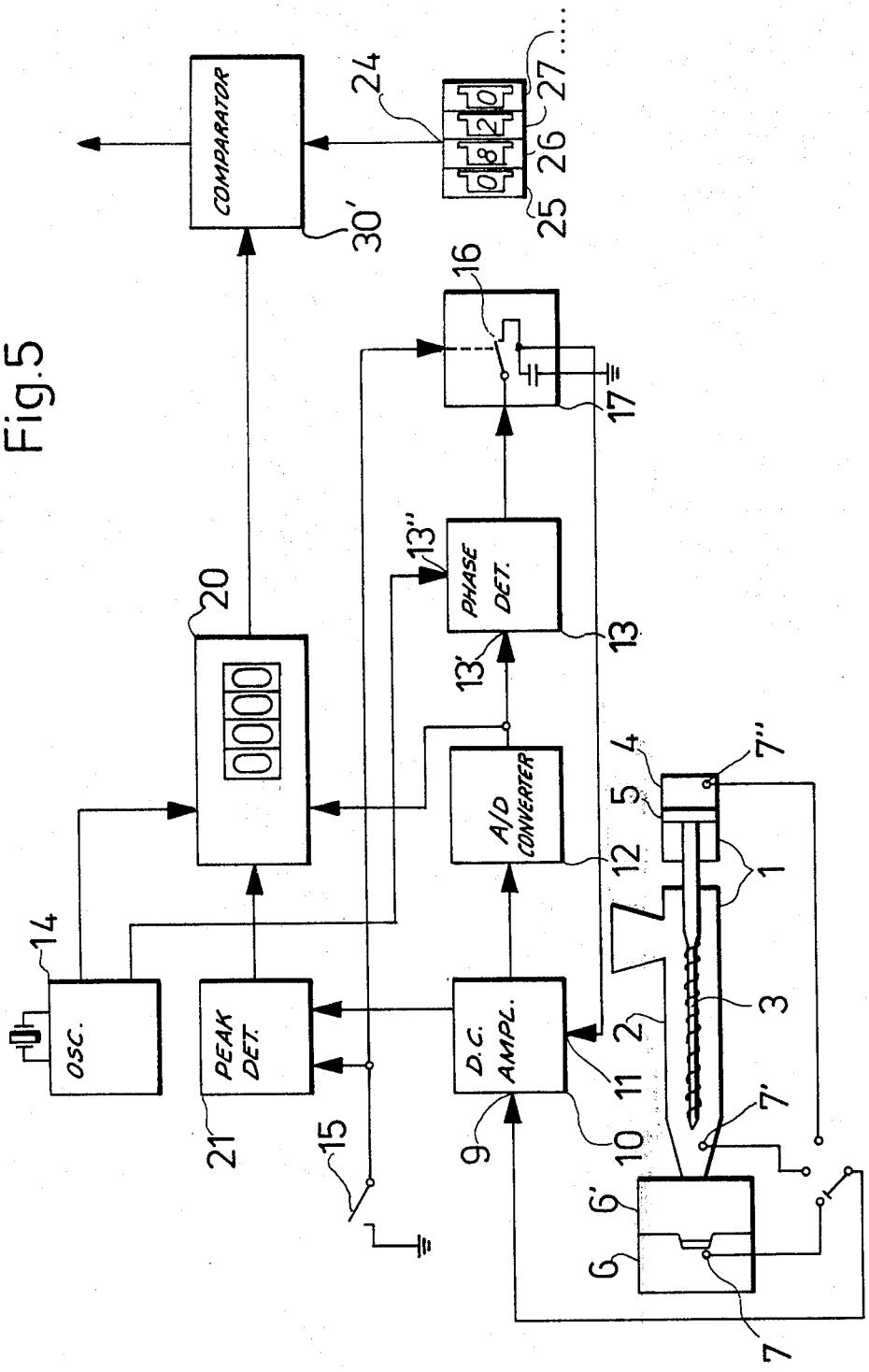
FIG. 5 shows an embodiment of the present invention utilized in an injection molding machine to switch from injection pressure to a lower pressure when the injection pressure reaches a predetermined value.

FIG. 5 shows an embodiment of the present invention which is identical to that as shown in FIG. 1 except that a comparator 30' has been added which compares the output of counter 20 to a reference pressure signal furnishes on lines 24 (indicated as a single line). The reference pressure signal is furnished by setting selection switches 25, 26 and 27 to furnish a desired pressure value. When the two inputs of comparator 30' are equal or when the signal at the output of counter 20 exceeds the desired pressure furnished on lines 24, a control signal is furnished which causes the injection molding machine to switch from the injection pressure to a lower pressure. Except for the addition of units 30' and selection switches 25–27 the circuit of FIG. 5 is identical to that of FIG. 1.

Figure 6:
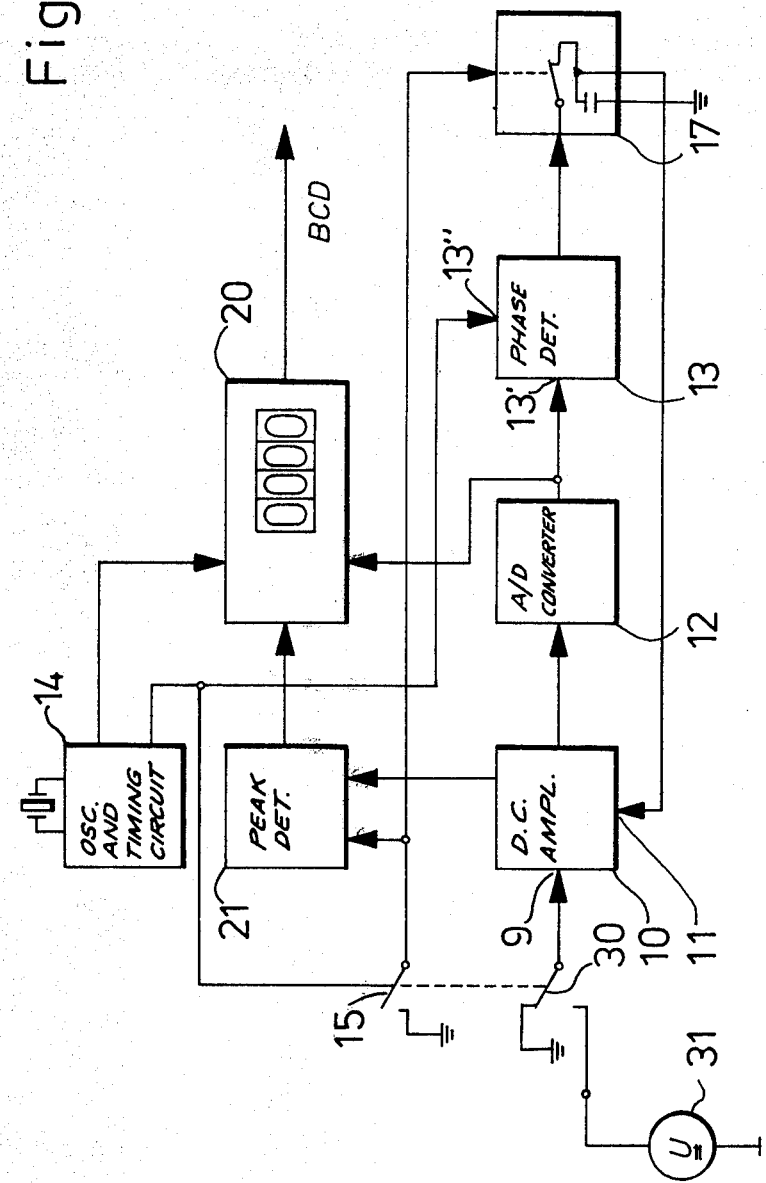
FIG. 6 shows an embodiment of the present invention utilized as a volt meter.

FIG. 6 shows a digital volt meter which is based on the same principle of operation as the circuit of FIG. 1. In addition to switch 15, a switch 30 which is mechanically coupled therewith is provided. Switch 30 is connected to input 9 of DC amplifier 10 and connects this input alternately to ground potential and to the voltage to be measured, herein denoted by reference numeral 31. During the measuring interval switch 15 of course is closed and switch 30 connects the input 9 of DC amplifier 10 to the voltage to be measured. Both switch 15 and switch 30 are electronic switches which are controlled at a frequency derived from the frequency of oscillator 14 by subdivision. In a preferred embodiment the ratio is 1/1000.

All of the above embodiments clearly show that the circuit of the present invention provides a very versatile arrangement for carrying out measurements of a determined characteristic while compensating for other factors which might introduce errors into this measurement. Thus it is for example possible to measure the rise in pressure in a pressurized system at a particular point in time. This is possible because the initial pressure at any particular point in time will be compensated for by the compensating voltage upon opening of switch 15. Closing of switch 15 then allows the measurement of the pressure rise during the measurement time interval.

Numerous other applications of the system of the present invention will come to mind of one skilled in the art.

While the invention has been illustrated and described as embodied in particular circuit components and is applied to pressure and voltage measurements only, it is not to be limited to the details shown, since various modifications and circuit changes may be made withoug departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. In measurement equipment having sensor means for furnishing a sensor output signal indicative of the value of a measured characteristic and wherein said sensor output signal undergoes undesired variations as a function of at least one factor other than said measured characteristic, equipment for compensating for said undesired variations, comprising, in combination, DC amplifier means having a first input connected to said sensor means for receiving said sensor output signal, a second input, and an amplifier output, for furnishing an amplifier output signal varying as a function of signals at said first and second inputs at said amplifier output; analog-digital converter means connected to said DC amplifier means for furnishing a digital signal having a frequency corresponding to said amplifier output signal; stabilized oscillator means for furnishing a frequency stabilized signal; phase detector means connected to said analog digital converter means and said stabilized oscillator means for furnishing a DC compensating voltage varying as a function of the phase difference between said digital signal and said frequency stabilized signal; storage means connected to said second input of said DC amplifier means; and means for connecting said storage means to said phase detector means prior to each measurement thereby creating a closed loop circuit, and for disconnecting said storage means from said phase detector means during each measurement, whereby the value of said DC compensating voltage immediately preceding each measurement is maintained during said measurement.

2. Equipment as set forth in claim 1, wherein said analog-digital converter means comprise a voltage-controlled oscillator.

3. Equipment as set forth in claim 1, further comprising counting means connected to the output of said analog-digital converter means for counting the number of cycles in said digital signal under control of timing signals and furnishing a corresponding counting output signal; timing signal furnishing means connected to said stabilized oscillator means and said counting means for furnishing said timing signals to said counting means at least in part in dependence on said frequency stabilized signal; and display means connected to said counting means for furnishing a visual display of said counting output signals.

4. Equipment as set forth in claim 3, wherein said timing signal furnishing means comprise means for furnishing a clear signal and means for furnishing a transfer signal; and wherein said counting means comprise at least one counter connected to said analog-digital converter means for counting said cycles in said digital signal and having a clear input connected to receive said clear signal, and latch means connected to said counter and said timing signal furnishing means for furnishing said counting signal to said display means in correspondence to the count on said counter at the time of receipt of said transfer signal.

5. Equipment as set forth in claim 4, wherein said timing signal furnishing means comprise frequency divider means connected to said frequency stabilized oscillator means for furnishing a frequency divided signal; and monostable multivibrator means connected to said frequency divider means for furnishing said transfer signal under control of said frequency divided signal and for furnishing said clear signal a predetermined time interval following said furnishing of said transfer signal.

6. Equipment as set forth in claim 5, wherein said monostable multivibrator means comprise a first monostable multivibrator connected to receive said frequency divided signal and having a first monostable multivibrator output for furnishing said transfer signal, and a second monostable multivibrator connected to said first monostable multivibrator and having a second monostable multivibrator output for furnishing said clear signal.

7. Equipment as set forth in claim 3, further comprising peak detector means connected to said DC amplifier means for furnishing a hold signal when said amplifier output signal is a maximum; and means for connecting said peak detector means to said counting means in such a manner that said counting output signal remains unchanged following receipt of said hold signal until the end of the measurement.

8. Equipment as set forth in claim 3, further comprising means for furnishing a reference counting signal; and comparator means connected between said means for furnishing a reference counting signal and said counting means for furnishing a control signal when said counting output signal corresponds to said reference counting signal.

* * * * *